US007038949B2

(12) United States Patent
Chae et al.

(10) Patent No.: US 7,038,949 B2
(45) Date of Patent: May 2, 2006

(54) NON-VOLATILE MEMORY DEVICE CAPABLE OF CHANGING INCREMENT OF PROGRAM VOLTAGE ACCORDING TO MODE OF OPERATION

(75) Inventors: Dong-Hyuk Chae, Seoul (KR); Dae-Seok Byeon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1 day.

(21) Appl. No.: 10/957,307

(22) Filed: Sep. 30, 2004

(65) Prior Publication Data

US 2005/0265073 A1 Dec. 1, 2005

(30) Foreign Application Priority Data

May 31, 2004 (KR) ..................... 10-2004-0039023

(51) Int. Cl.
*G11C 16/06* (2006.01)

(52) U.S. Cl. .......................... 365/185.23; 365/185.19; 365/185.18

(58) Field of Classification Search ........... 365/185.23, 365/185.19, 185.18
See application file for complete search history.

(56) References Cited

U.S. PATENT DOCUMENTS 5,642,309 A 6/1997 Kim
6,707,716 B1 3/2004 Natori
6,804,150 B1 * 10/2004 Park et al. ............. 365/185.23

FOREIGN PATENT DOCUMENTS

JP 10-083687 3/1998
KR 1020020039744 5/2002

OTHER PUBLICATIONS

English language abstract of Japanese Publication No. 10-083687.
English language abstract of Korean Pulbication No. 1020020039744.

* cited by examiner

*Primary Examiner*—Huan Hoang
(74) *Attorney, Agent, or Firm*—Marger Johnson & McCollom, P.C.

(57) ABSTRACT

A non-volatile memory device includes a word line voltage generator circuit for generating a word line voltage to be supplied to a selected row in response to step control signals and a program controller for sequentially activating the step control signals during a program cycle. During the program cycle, the word line voltage generator circuit controls the increment of the word line voltage differently according to the mode of operation, namely, a test mode or a normal mode. Thus test time can be shortened.

22 Claims, 7 Drawing Sheets

NON-VOLATILE MEMORY DEVICE CAPABLE OF CHANGING INCREMENT OF PROGRAM VOLTAGE ACCORDING TO MODE OF OPERATION

CROSS-REFERENCE TO RELATED APPLICATIONS

This U.S. non-provisional patent application claims priority under 35 U.S.C. § 119 of Korean Patent Application 2004-39023 filed on May 31, 2004, the entire contents of which are hereby incorporated by reference.

FIELD OF THE INVENTION

The present invention is a semiconductor memory device, and, in particular, a non-volatile memory device.

BACKGROUND OF THE INVENTION

In general, semiconductor memory devices are tested in a package and/or wafer level to judge whether defects exit therein. This is accomplished by storing data in memory cells and then reading the stored data from the memory cells. For example, test data is programmed in memory cells of a non-volatile memory device, and then a read operation is performed with a word line voltage varied. As a result of the read operation, this test is capable of measuring a threshold voltage distribution of memory cells. Defects of memory devices, such as a short circuit between cells, bit lines, or word lines, and the breaking of bit lines or word lines, can be judged by parsing the measured threshold voltage distribution. A program operation for this testing (hereinafter, referred to as a test program operation) is performed in the same manner as a normal program operation.

In common, an incremental step pulse programming (ISPP) scheme has been utilized to control the threshold voltage distribution precisely. With this ISPP scheme, as illustrated in FIG. 1, a program voltage Vpgm is stepwise increased as program loops of a program cycle are repeated. As is well known, each program loop includes a program period and a program verify period. The program voltage Vpgm is increased by a given increment ΔVpgm, and a program time tPGM is continuously maintained during each program loop. In accordance with the above ISPP scheme, a threshold voltage of a cell is increased by ΔVpgm during each program loop. For this, the increment of the program voltage has to be set small to obtain a narrow width of a threshold voltage distribution of finally programmed cells. As the increment of the program voltage decreases, the number of program loops of a program cycle increases. Accordingly, the program loop number may be determined to obtain an optimum threshold voltage distribution without limiting performance of a memory device.

Exemplary circuits for generating a program voltage according to the ISPP scheme are disclosed in U.S. Pat. No. 5,642,309 entitled "AUTO-PROGRAM CIRCUIT IN A NONVOLATILE SEMICONDUCTOR MEMORY DEVICE" and KP laid-open No. 2002-39744 entitled "FLASH MEMORY DEVICE CAPABLE OF PREVENTING PROGRAM DISTURB AND METHOD OF PROGRAMMING THE SAME".

For measuring the threshold voltage distribution of memory cells in order to judge whether defects exist, it is unnecessary to control the threshold voltage distribution tightly. This is because a test operation is carried out to confirm whether memory cells are normally programmed or whether programmed memory cells are incorrectly judged as erased memory cells, rather than judging whether memory cells exist in a desired threshold voltage distribution. Shortening the test time means increased productivity. Accordingly, for performing the test program operation in the same manner as the normal program operation, the time needed to program memory cells during the test program operation is identical to that during the normal program operation. Also, during the test program operation the program voltage is generated in the same manner as that of the normal program operation. Thus it is difficult to shorten the time taken during the test program operation. However, it is possible to improve the productivity by shortening this time required to program memory cells during the test program operation.

SUMMARY OF THE INVENTION

It is therefore an object of the invention to provide a non-volatile memory device capable of shortening the test time.

It is another object of the invention to provide a non-volatile memory device capable of varying the increment of the program voltage according to the modes of operation.

In accordance with one aspect of the present invention, a non-volatile memory device is provided which comprises an array of memory cells arranged in rows and columns. The device further comprises a word line voltage generator circuit for generating a word line voltage in response to step control signals, and a program controller for sequentially activating the step control signals during a program cycle. During the program cycle, the word line voltage generator circuit controls an increment of the word line voltage differently according to a mode of operation.

In this embodiment, an increment of the word line voltage during a test program mode of operation is larger than that during a normal program mode of operation.

In this embodiment, each of the memory cells comprises a multi-level memory cell for storing n-bit data. Alternatively, each of the memory cells comprises a single-level memory cell for storing 1-bit data.

In this embodiment, the word line voltage generator circuit comprises a voltage divider that divides the word line voltage in response to a mode select signal indicating the mode of operation and the step control signals.

In this embodiment, the voltage divider comprises a resistor connected between the word line voltage and a divided voltage; and first and second variable resistance circuits connected in series between the divided voltage and a ground voltage, wherein the first variable resistance circuit has a first resistance value and a second resistance value, being different from the first resistance value, each of which is selected by the mode select signal, and the second variable resistance circuit has a plurality of resistance values, being different from one another, each of which is selected by the step control signals.

In this embodiment, the mode select signal is activated during a test program mode of operation.

In this embodiment, the word line voltage is stepwise increased whenever program loops of the program cycle are repeated.

In this embodiment, the voltage divider comprises a first variable resistance circuit connected between the word line voltage and a divided voltage and controlled by the mode select signal; and second and third variable resistance circuits connected in series between the divided voltage and a ground voltage, the second variable resistance circuit being controlled by the mode select signal and the third variable resistance circuit being controlled by the step control signal, whereby a start voltage level of the word line voltage is maintained constantly regardless of the mode of operation.

In this embodiment, the first variable resistance circuit has a first resistance value and a second resistance value, being different from the first resistance value, each of which is selected by the mode select signal; the second variable resistance circuit has a third resistance value and a fourth resistance value, being different from the third resistance value, each of which is selected by the mode select signal, and the second variable resistance circuit has a plurality of resistance values, being different from one another, each of which is selected by the step control signals.

In this embodiment, the step control signals are sequentially activated according to whether each of the program loops of the program cycle is passed.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

The preferred embodiment of the invention will be more fully described with reference to the attached drawings.

Figure 1:
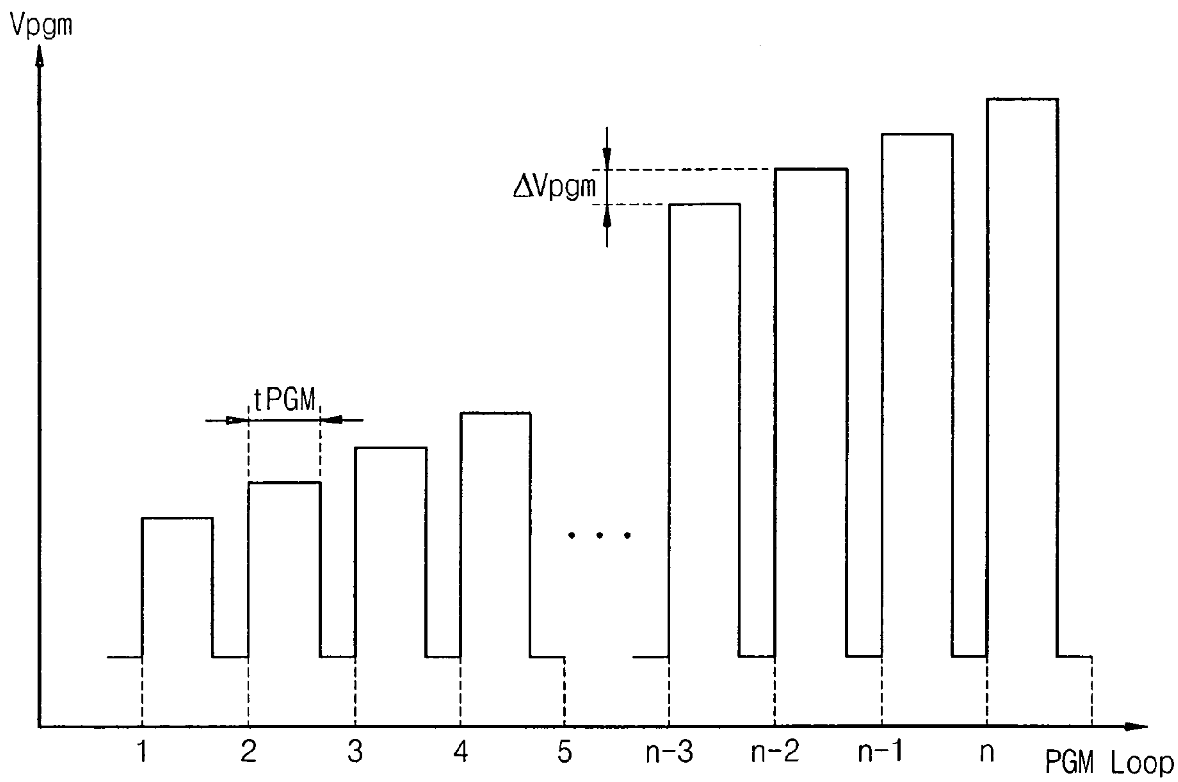
FIG. 1 is a diagram showing a word line voltage variation according to a conventional program method.
Figure 2:
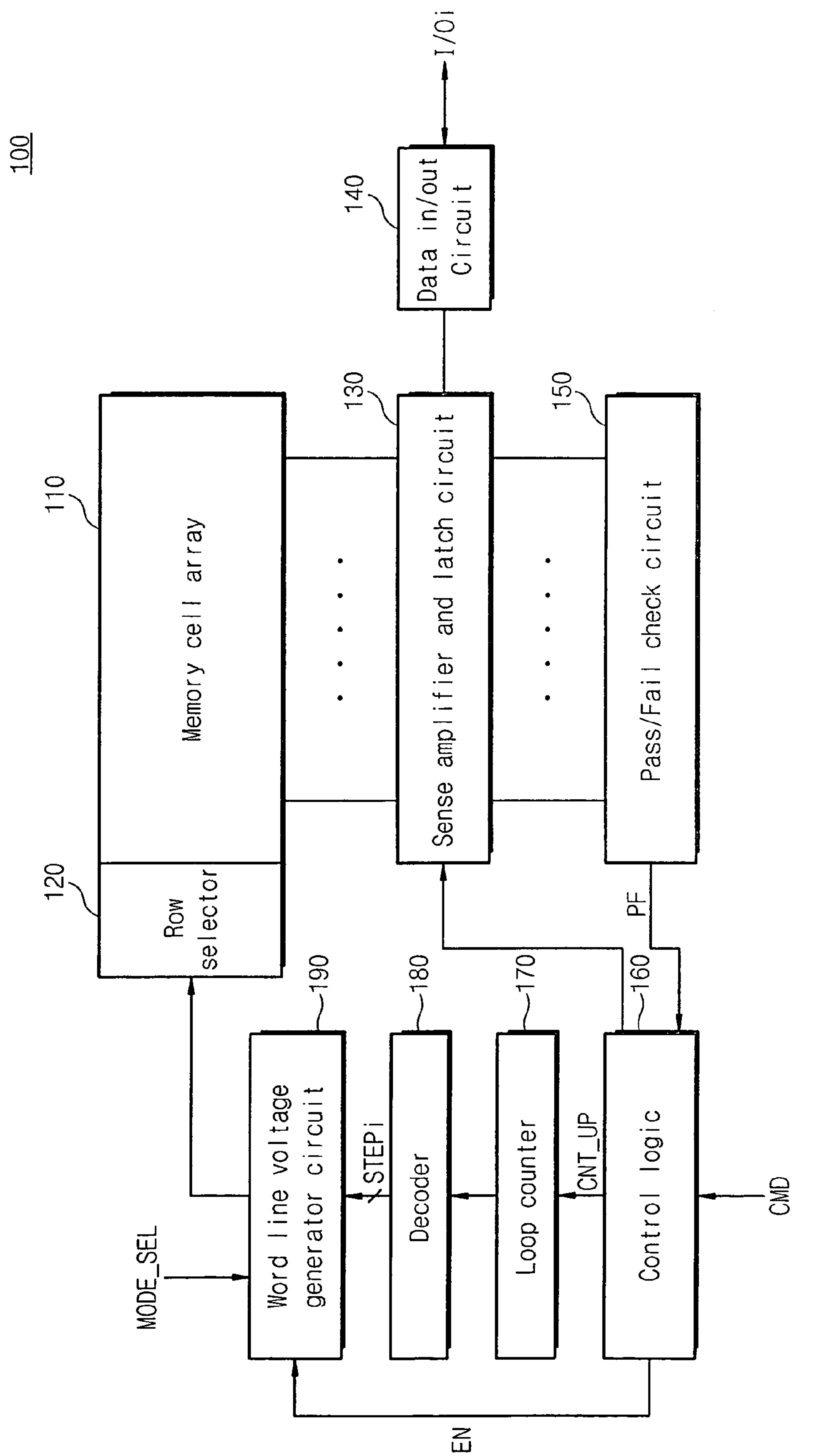
FIG. 2 is a schematic block diagram of a non-volatile memory device according to the present invention.

FIG. 2 schematically shows a non-volatile memory device according to the present invention. A non-volatile memory device 100 according to the present invention is a flash memory device. However, it is obvious to ones skilled in the art that the present invention can be applied to other memory devices (e.g., MROM, PROM, FRAM, etc.).

The non-volatile memory device 100 of the present invention includes a memory cell array 110 that has memory cells arranged in rows (or word lines) and columns (or bit lines). Each of the memory cells stores 1-bit data. Alternatively, each of the memory cells stores n-bit data (n is an integer greater than 1). A row selector circuit 120 selects at least one of the rows in response to a row address and drives the selected row with a word line voltage from a word line voltage generator circuit 190. A sense amplifier and latch circuit 130 is controlled by control logic 160 and reads out data from the memory cell array 110 during a read/verify operation. Data read during the read operation is outputted to an external port via a data input/output circuit 140, while data read during the verify operation is transferred to a pass/fail check circuit 150. The sense amplifier and latch circuit 130 receives data to be written into the memory cell array 110 via the data input/output circuit 140 during a program operation, and drives respective bit lines with a program voltage (e.g., a ground voltage) or a program inhibit voltage (e.g., a power supply voltage) according to the received data.

The pass/fail check circuit 150 judges whether data values from the sense amplifier and latch circuit 130 at a program/erase verify operation have the same data (e.g., a pass data value), and outputs a pass/fail signal PF as the judgment result to the control logic 160. The control logic 160 activates the word line voltage generator circuit 190 in response to a command informing about a program cycle, and controls the sense amplifier and latch circuit 130 during each program loop of the program cycle. The control logic 160 activates a count-up signal CNT_UP in response to the pass/fail signal PF from the pass/fail check circuit 150. For example, when the pass/fail signal PF indicates that at least one of the data values from the sense amplifier and latch circuit 130 is a no-pass data value, the control logic 160 activates the count-up signal CNT_UP. That is, in the case that a program operation of a current program loop is not performed normally, the control logic 160 activates the count-up signal CNT_UP. On the other hand, in the case that a program operation of a current program loop is performed normally, the control logic 160 inactivates the count-up signal CNT_UP so that the program cycle is ended.

A loop counter 170 counts the program loop number in response to activation of the count-up signal CNT_UP. A decoder 180 decodes the output of the loop counter 170 to generate step control signals STEPi (i=0-n). For example, as the output value of the loop counter 170 is increased, the step control signals STEPi are activated sequentially. The word line voltage generator circuit 190 is activated by an enable signal EN from the control logic 160 and generates the word line voltage in response to the mode select signal MODE_SEL and the step control signals STEPi.

The word line voltage generator circuit 190 stepwise increases the word line voltage as the step control signals STEPi are sequentially activated. The increment of the word line voltage varies according to whether the mode select signal MODE_SEL indicates a test program operation. For example, the increment of the word line voltage when the mode select signal MODE_SEL indicates a test program operation is higher than that when the mode select signal MODE_SEL indicates a normal program operation. The greater the increment of the word line voltage, the greater the variation of the threshold voltage. That is, as the increment of the word line voltage becomes larger, the time taken to program a memory cell up to a target threshold voltage is shortened. As a result, the time for the test program operation becomes shorter than that for the normal program operation.

In this embodiment, the control logic 160, the loop counter 170, and the decoder 180 constitute a program controller that sequentially activates the step control signals during the program cycle. The mode select signal MODE_SEL can be produced by the control logic 160, a bonding circuit, or a fuse circuit. For example, the control logic 160 can be configured to activate the mode select signal MODE_SEL in response to a test command. In case of the bonding circuit, the mode select signal MODE_SEL of an active state can be provided from a tester. In case of the fuse circuit, a fuse circuit can be configured such that the mode select signal MODE_SEL is activated during the test program operation and inactivated after the test program operation. The mode select signal MODE_SEL is activated only at the test program operation although any one of the above-mentioned circuits is utilized.

Figure 3:
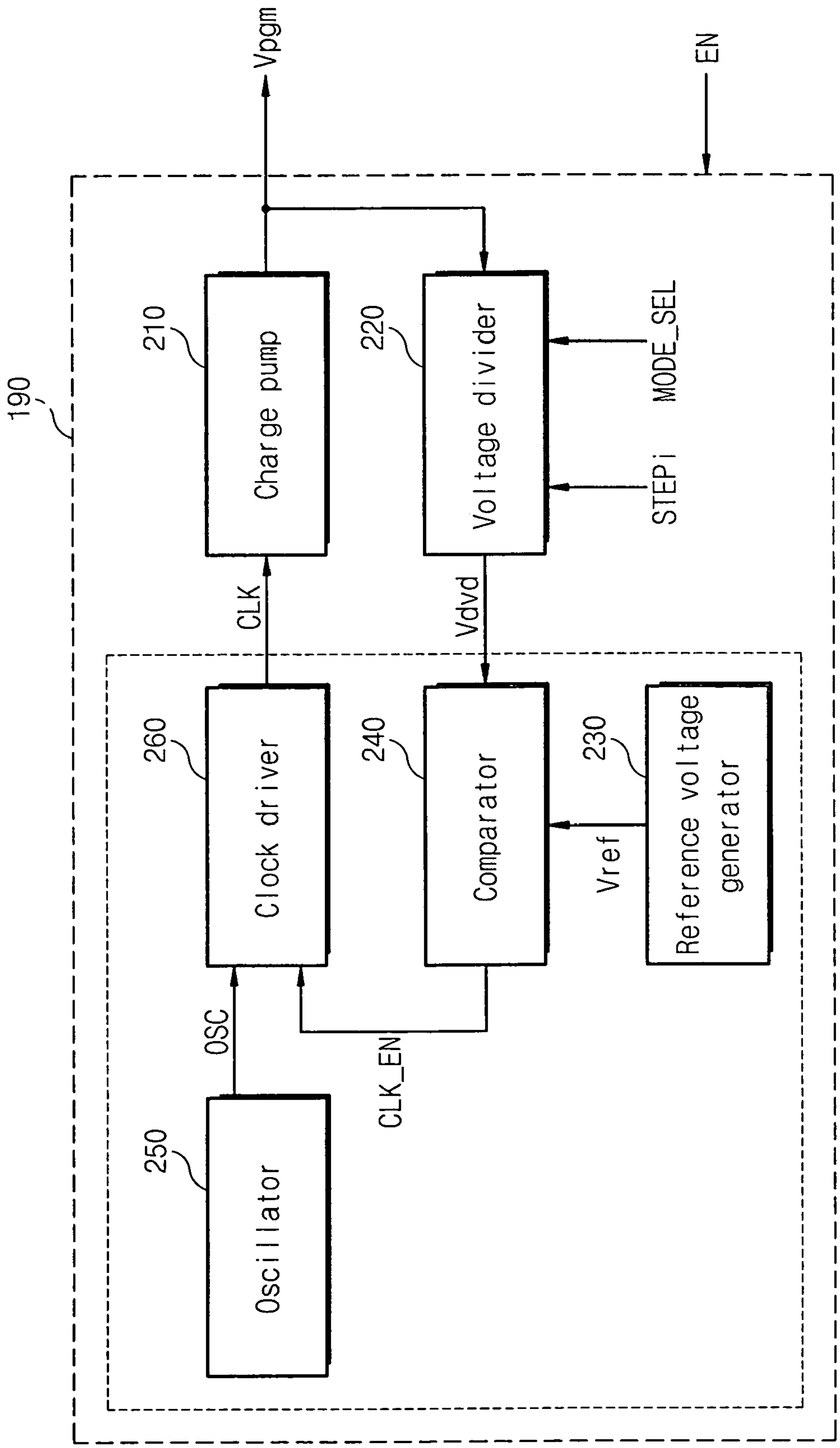
FIG. 3 is a schematic block diagram of a word line voltage generator circuit illustrated in FIG. 2.

FIG. 3 is a schematic block diagram of a word line voltage generator circuit illustrated in FIG. 2. Referring to FIG. 3, the word line voltage generator circuit 190 according to the present invention includes a charge pump 210, a voltage divider 220, a reference voltage generator 230, a comparator 240, an oscillator 250, and a clock driver 260, and is activated by an enable signal EN from a control logic 160 in FIG. 2.

The charge pump 210 generates a word line voltage Vpgm as a program voltage in response to a clock signal CLK. The voltage divider 220 divides and outputs the word line voltage Vpgm in response to a mode select signal MODE_SEL and step control signals STEPi. A division ratio of the voltage divider 220 is determined by the mode select signal MODE_SEL and the step control signals STEPi. For example, the division ratio is stepwise decreased according to sequential activation of the step control signals STEPi, so that the word line voltage Vpgm is increased by the decreased division ratio. This will be more fully described hereinafter. Variation of the division ratio is changed according to whether the mode select signal MODE_SEL indicates a test program operation. For example, its variation during the test program operation becomes more than that during a normal program operation. This means that the increment of the program voltage during the test program operation is increased compared with that during the normal program operation.

Figure 4:
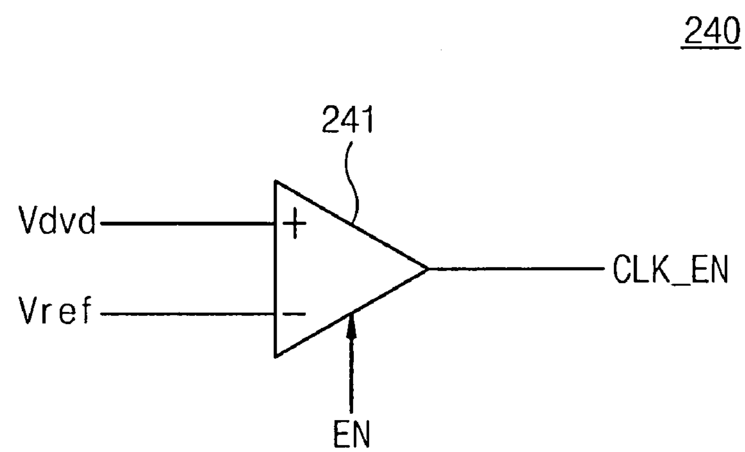
FIG. 4 is an exemplary circuit diagram of a comparator illustrated in FIG. 3.
Figure 5:
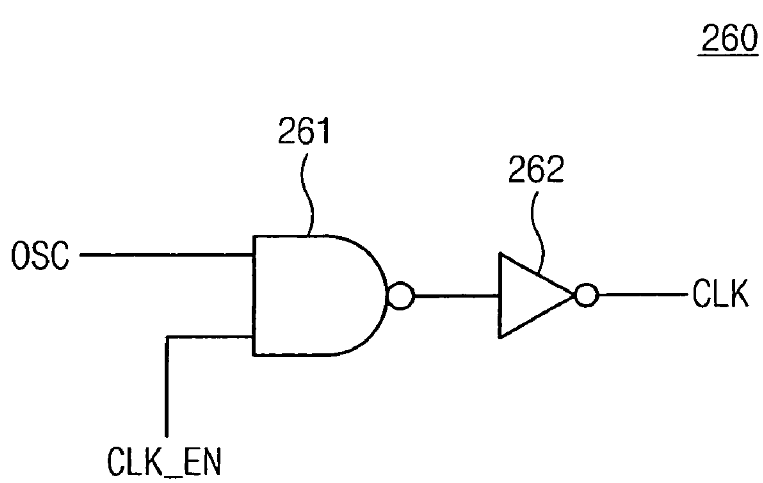
FIG. 5 is an exemplary circuit diagram of a clock driver illustrated in FIG. 3.

Still referring to FIG. 3, the comparator 240 compares a divided voltage Vdvd from the voltage divider 220 with a reference voltage Vref from the reference voltage generator 230 and generates a clock enable signal CLK_EN as the comparison result. The comparator 240 is comprised of a differential amplifier 241 as illustrated in FIG. 4. For example, when the divided voltage Vdvd is lower than the reference voltage Vref, the comparator 240 activates the clock enable signal CLK_EN. The clock driver 260 outputs the clock signal CLK as an oscillation signal from the oscillator 250 in response to the clock enable signal CLK_EN. The clock driver 260 is comprised of a NAND gate 261 and an inverter 262, as illustrated in FIG. 5. For example, when the clock enable signal CLK_EN is activated high, the oscillator signal OSC is outputted as the clock signal CLK. This means that the charge pump 210 operates. When the clock enable signal CLK_EN is inactivated low, the oscillation signal OSC is blocked so that the clock signal CLK is not toggled. This means that the charge pump 210 does not operate.

In this embodiment, the comparator 240, the oscillator 250, and the clock driver 260 constitute a circuit that controls the charge pump 210 according to the divided voltage of the voltage divider 220.

As well known from the above description, if the word line voltage Vpgm is lower than a required voltage, the clock signal CLK is generated so the charge pump 210 operates. If the word line voltage Vpgm reaches the required voltage, no clock signal CLK is generated, so that the charge pump 210 does not operate. The word line voltage will be generated by the above-mentioned stages.

In generating the word line voltage, its increment is changed according to the mode of operation, that is, whether the mode select signal MODE_SEL is activated. With the above description, the increment of the word line voltage during the test program operation is more than that during the normal program operation.

Figure 6:
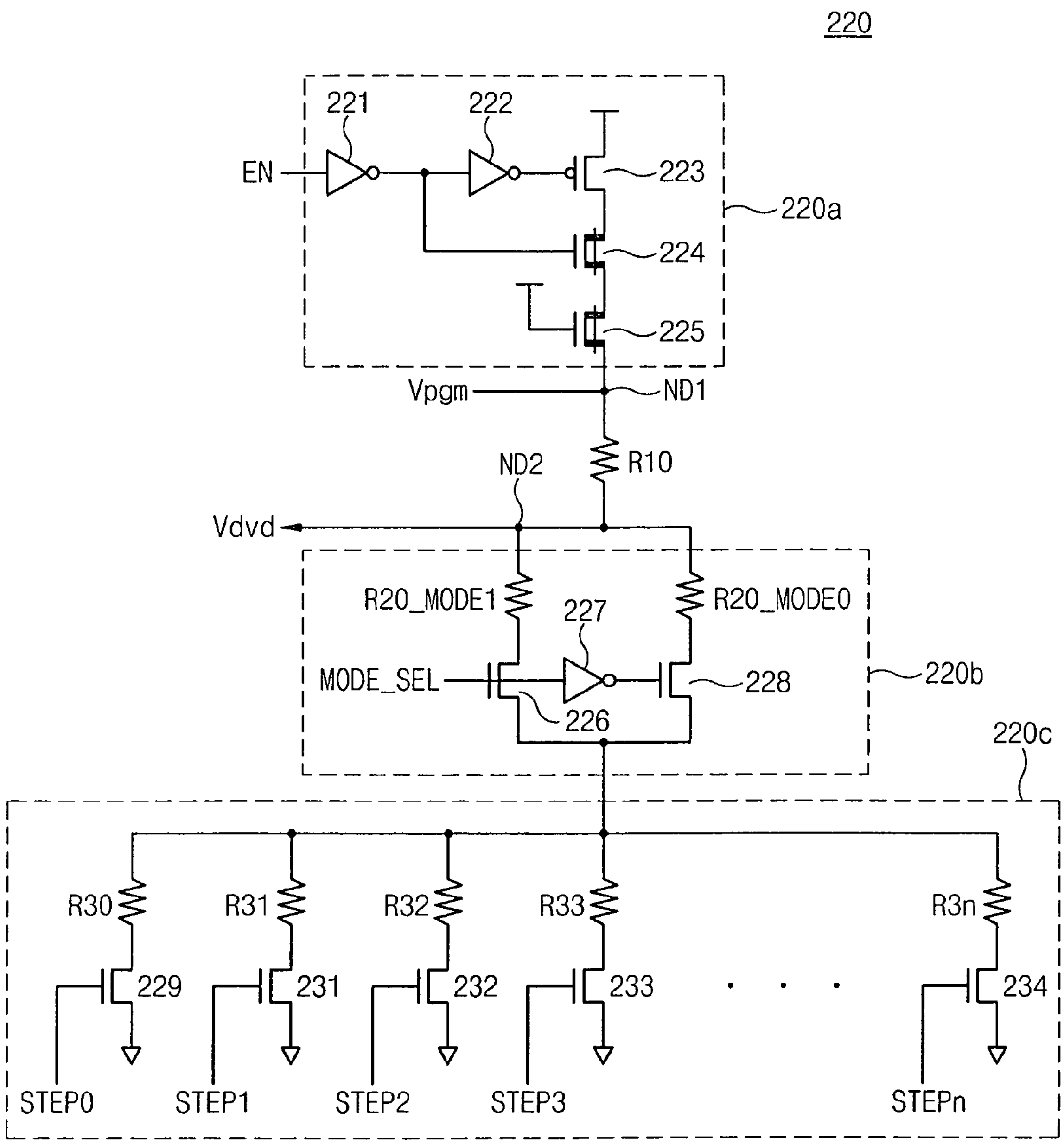
FIG. 6 is an exemplary circuit diagram of a voltage divider illustrated in FIG. 3.

FIG. 6 is an exemplary circuit diagram of the voltage divider illustrated in FIG. 3. Referring to FIG. 6, the voltage divider 220 includes a discharge part 220*a*, a resistor R10, a first variable resistance part 220*b*, and a second variable resistance part 220*c*. The discharge part 220*a* is connected to an input terminal ND1 for receiving the word line voltage Vpgm, and sets the high voltage (e.g., the word line voltage) of the input terminal ND1 to a power supply voltage in response to an enable signal EN. The discharge part 220*a* comprises inverters 221 and 222, a PMOS transistor 223, and depletion-type NMOS transistors 224 and 225, which are connected as illustrated in FIG. 6. The depletion-type NMOS transistors 224 and 225 are well known high-voltage transistors that are fabricated to endure a high voltage.

The resistor R10 is connected between the input terminal ND1 and an output terminal ND2 for outputting a divided voltage Vdvd. The first variable resistance part 220*b* has a first resistance value and a second resistance value, one of which is selected according to whether a mode select signal MODE_SEL indicates a test program operation. The first variable resistance part 220*b* includes two resistors R20_MODE0 and R20_MODE1, NMOS transistors 226 and 228, and an inverter 227, which are connected as illustrated in FIG. 6. With this configuration, the resistor R20_MODE0 is used when the mode select signal MODE_SEL is at a low level or when it indicates a normal program operation. The resistor R20_MODE1 is used when the mode select signal MODE_SEL is at a high level or when it indicates a test program operation. In this embodiment, the resistance value of the resistor R20_MODE1 is less than that of the resistor R20_MODE0. The resistance value of R20_MODE0 is referred to as the first resistance value, and the resistance value of R20_MODE1 is referred to as the second resistance value.

Still referring to FIG. 6, the second variable resistance part 220*c* has a plurality of resistance values, which are serially selected according to sequential activation of step control signals STEPi. The second variable resistance part 220*c* includes a plurality of resistors R30–R3*n* and a plurality of NMOS transistors 229–234, which are connected as illustrated in FIG. 6. The resistors R30–R3*n* correspond to NMOS transistors 229–234, respectively. The NMOS transistors 229–234 are controlled by corresponding step control signals STEPi, respectively. The step control signals STEPi are sequentially activated as program loops of a program cycle are repeated. That is, only one of the step control signals is activated in any program loop.

The divided voltage Vdvd is determined by resistance values of the resistor R10 and the variable resistance parts 220*b* and 220*c*, and is expressed by $$Vdvd=Vpgm(R2/(R1+R2)) \quad \text{[Equation 1]}$$

In equation 1, R1 indicates a resistance value of the resistor R10, and R2 indicates a sum of resistance values of the first and second variable resistance parts 220*b* and 220*c*. The divided voltage Vdvd determined by equation 1 is compared with a reference voltage Vref through a comparator 240. The word line voltage Vpgm is increased by a given increment according to the comparison result. The word line voltage Vpgm is expressed by the following equation obtained from the above stages.

$$Vpgm=Vref(1+R1/R2) \quad \text{[Equation 2]}$$

Figure 7:
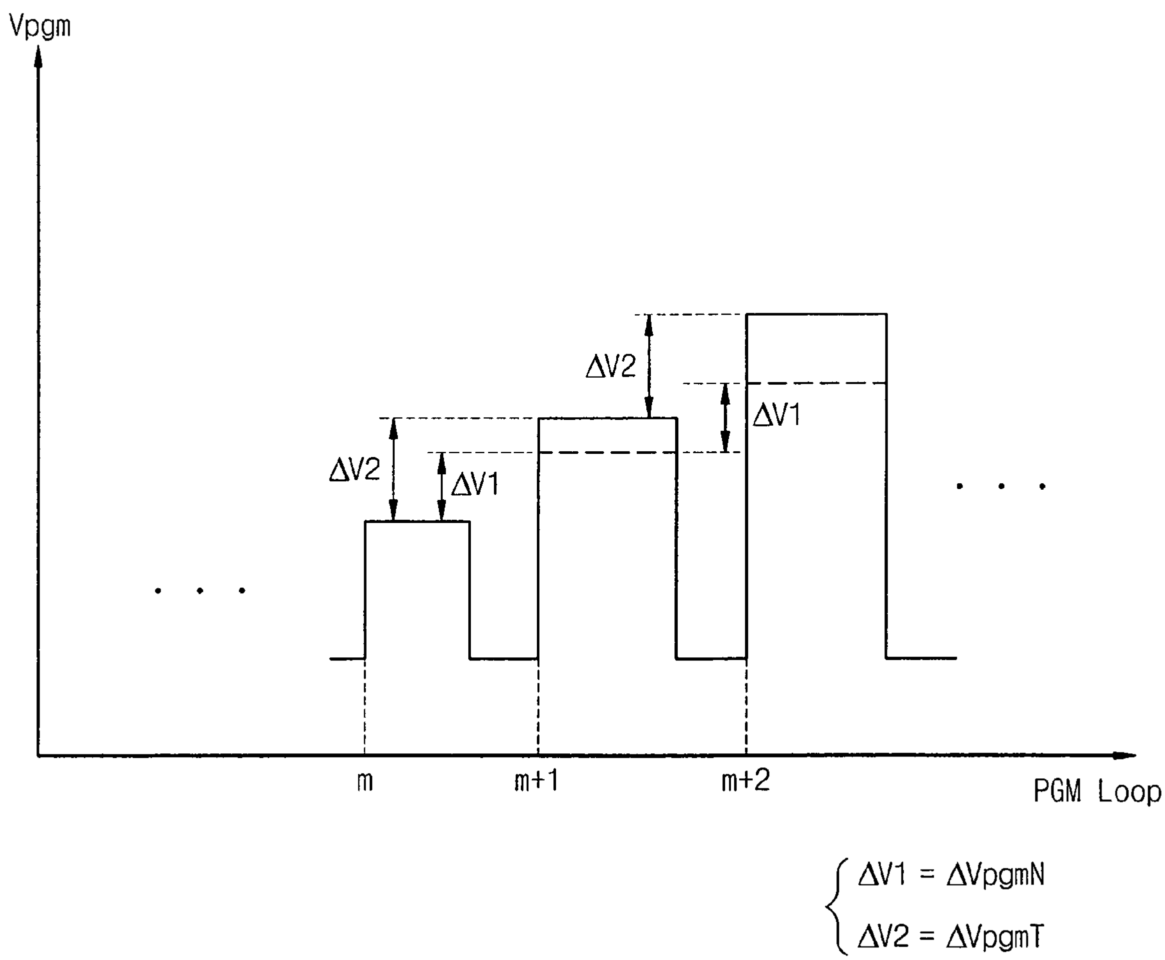
FIG. 7 is a diagram showing a word line voltage variation according to a program method of the present invention.

As understood from equation 2, the increment of the word line voltage Vpgm is inversely proportional to the variation of the resistance value R2. As described above, the resistance value R2 when the mode select signal MODE_SEL is at a high level is less than that when the mode select signal MODE_SEL is at a low level. Accordingly, as the resistance value R2 becomes small, the increment of the word line voltage Vpgm is increased in each program loop. As illustrated in FIG. 7, when the resistor R20_MODE1 of the first variable resistance part 220*b* is selected during the test program operation, the increment ΔVpgmT of the word line voltage Vpgm during the test program operation is larger than that of ΔVpgmN thereof. As the increment of Vpgm becomes large, memory cells are programmed more rapidly under the same program conditions. This means that the time required for the test program operation is shortened compared to the time required for the normal program operation.

An operation of a non-volatile memory device according to the present invention will be more fully described with reference to accompanying drawings. As well known, in case of a non-volatile memory device such as a NAND-type flash memory device, a program cycle consists of a plurality of program loops, each of which is comprised of a program period and a program verify period. Before a test program operation is carried out, data to be programmed is loaded into the sense amplifier and latch circuit 130. Afterward, as a program command is provided to the non-volatile memory device, the test program operation will be carried out. A mode select signal MODE_SEL is set to a high level during the test program operation.

The control logic 160 activates an enable signal EN in response to an input of a program command, and the word line voltage generator circuit 190 starts to generate a word line voltage Vpgm in response to the activation of the enable signal EN. Here, during the first program loop, the step control signal STEP0 is activated by means of the loop counter 170 and the decoder 180. As the step control signal STEP0 is activated and a mode select signal MODE_SEL is set to a high level, the word line voltage Vpgm is determined by equation 2. In equation 2, the resistance value R2 consists of resistance values of the resistor R20_MODE1 of the first variable resistance part 220*b* and the resistor R30 of the second variable resistance value 220*c*. If the word line voltage Vpgm reaches a desired voltage level of the first program loop, memory cells may be programmed in a well-known manner.

If a program operation of the first program loop is ended, a program verify operation is performed. During the program verify operation, the sense amplifier and latch circuit 130 reads out data from the memory cell array 110 and outputs the read data to the pass/fail check circuit 150. The pass/fail check circuit 150 judges whether data values from the sense amplifier and latch circuit 130 have the same data, that is, pass data values. If at least one of the data values has a no-pass data value, the control logic 160 activates a count-up signal CNT_UP. The loop counter 170 performs a count-up operation in response to the count-up signal CNT_UP. The counted value indicates a next program loop. The counted value is decoded by the decoder 180, so that a step control signal STEP1 is activated. As the resistance value of the second variable resistance part 220*c* is decreased, the word line voltage Vpgm is increased by a given increment. The above-described test program operation is repeated until data values from the sense amplifier and latch circuit 130 all have the pass data value.

In other words, the increment of the word line voltage Vpgm becomes large by controlling the resistance value R2 of the voltage divider 220. As the increment of the word line voltage Vpgm becomes large during the test program operation as compared with that during the normal program operation, it is capable of shortening the time required to perform the test program operation.

Figure 8:
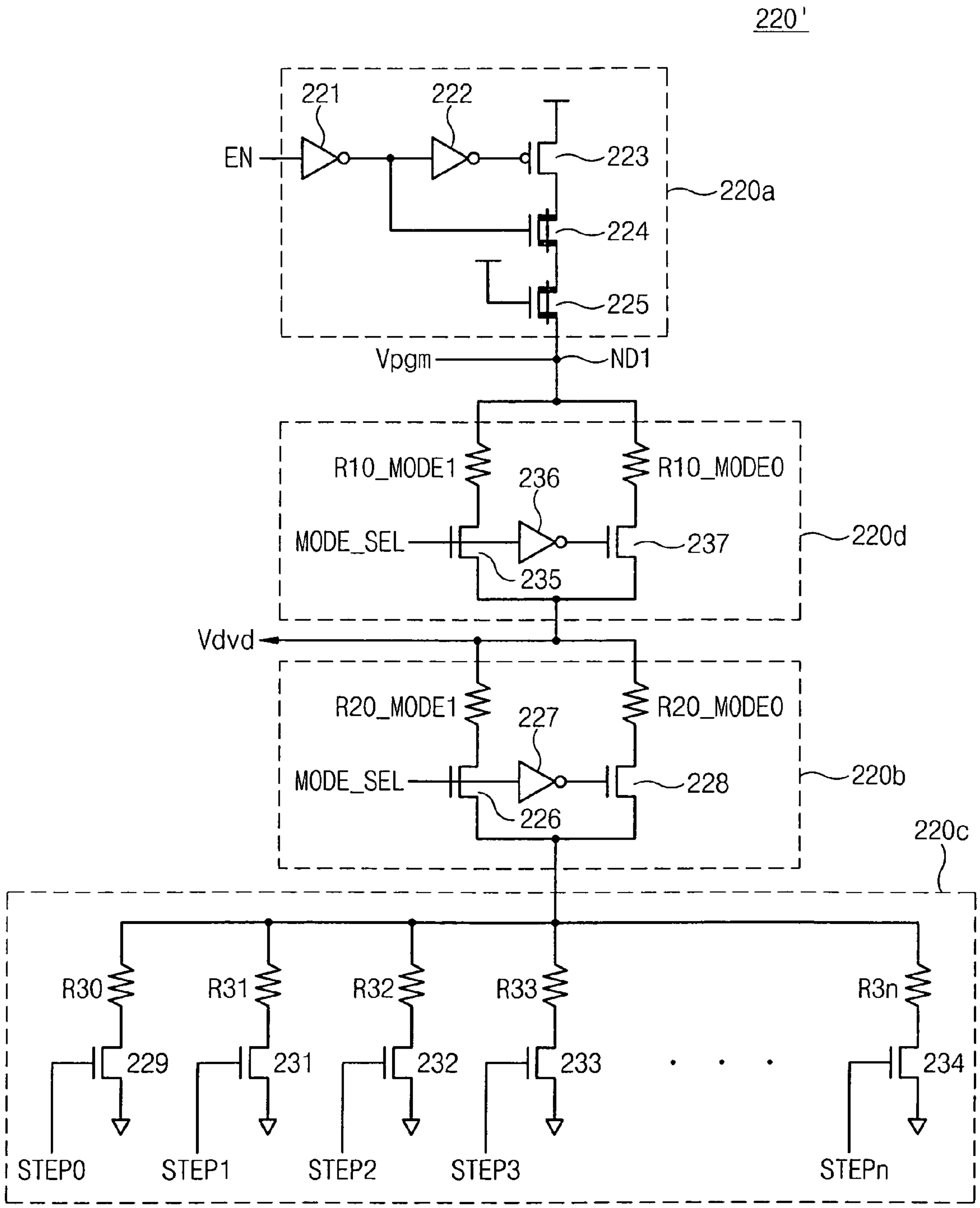
FIG. 8 is an exemplary circuit diagram of a voltage divider illustrated in FIG. 3 according to another embodiment.

FIG. 8 is an exemplary circuit diagram of a voltage divider according to another embodiment of the present invention. The voltage divider 220' in FIG. 8 is identical to that in FIG. 6 except that a resistor R10 is replaced with a variable resistance circuit. In the case of the voltage divider 220 in FIG. 6, a resistance value of the first variable resistance part 220*b* is varied to change the increment of a word line voltage Vpgm. In this case, an initial voltage level of the word line voltage Vpgm as well as the increment thereof is changed. Accordingly, a third variable resistance part 220*d* is used to prevent the initial voltage level of the word line voltage Vpgm from being changed, and is configured the same as the first variable resistance part 220*b*. The third variable resistance part 220*d* performs a compensating function so that the initial voltage level of the word line voltage Vpgm is not changed. For example, a resistance value of the resistor R10_MODE1 is set to be less than that of a resistor R10_MODE0. Except for this difference, the voltage divider 220' in FIG. 8 is identical to that 220 in FIG. 6, and description thereof is thus omitted.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A non-volatile memory device comprising an array of memory cells arranged in rows and columns, the device further comprising:

a word line voltage generator circuit for generating a word line voltage in response to step control signals; and a program controller for sequentially activating the step control signals during a program cycle, wherein during the program cycle, the word line voltage generator circuit controls an increment of the word line voltage differently according to a mode of operation.

2. The non-volatile memory device of claim 1, wherein the increment of the word line voltage during a test program mode of operation is larger than that during a normal program mode of operation.

3. The non-volatile memory device of claim 1, wherein each of the memory cells comprises a multi-level memory cell for storing n-bit data.

4. The non-volatile memory device of claim 1, wherein each of the memory cells comprises a single-level memory cell for storing 1-bit data.

5. The non-volatile memory device of claim 1, wherein the word line voltage is stepwise increased whenever program loops of the program cycle are repeated.

6. The non-volatile memory device of claim 1, wherein the step control signals are sequentially activated according to whether each program loop of the program cycle is passed.

7. The non-volatile memory device of claim 1, wherein the word line voltage generator circuit comprises a voltage divider that divides the word line voltage in response to a mode select signal indicating the mode of operation and the step control signals.

8. The non-volatile memory device of claim 7, wherein the voltage divider comprises:

a resistor connected between the word line voltage and a divided voltage; and a first and a second variable resistance circuit connected in series between the divided voltage and a ground voltage, wherein the first variable resistance circuit has a first resistance value and a second resistance value that is different from the first resistance value, each of which is selected by the mode select signal, and the second variable resistance circuit has a plurality of resistance values being different from one another, each of which is selected by the step control signals.

9. The non-volatile memory device of claim 8, wherein the mode select signal is activated during a test program mode of operation.

10. The non-volatile memory device of claim 7, wherein the voltage divider comprises:

a first variable resistance circuit connected between the word line voltage and a divided voltage and controlled by the mode select signal; and a second and a third variable resistance circuit connected in series between the divided voltage and a ground voltage, the second variable resistance circuit being controlled by the mode select signal and the third variable resistance circuit being controlled by the step control signal, whereby a start voltage level of the word line voltage is maintained constantly regardless of the mode of operation.

11. The non-volatile memory device of claim 10, wherein the first variable resistance circuit has a first resistance value and a second resistance value that is different from the first resistance value, each of which is selected by the mode select signal;

the second variable resistance circuit has a third resistance value and a fourth resistance value that is different from the third resistance value, each of which is selected by the mode select signal, and the third variable resistance circuit has a plurality of resistance values being different from one another, each of which is selected by the step control signals.

12. A non-volatile memory device comprising an array of memory cells arranged in rows and columns, the device further comprising:

a charge pump for generating a program voltage to be supplied to a selected row in response to a clock signal;

a voltage divider for dividing the program voltage in response to step control signals and a mode select signal; and a charge pump controller for generating the clock signal according to whether the divided voltage is lower than a reference voltage, wherein a division rate of the program voltage is varied according to whether the mode select signal is activated, so that an increment of the program voltage is set to be different according to a mode of operation.

13. The non-volatile memory device of claim 12, wherein the mode select signal is activated during a test program mode of operation and inactivated during a normal program mode of operation.

14. The non-volatile memory device of claim 12, wherein an increment of the program voltage during a test program mode of operation is larger than that during a normal program mode of operation.

15. The non-volatile memory device of claim 12, wherein each of the memory cells comprises a multi-level memory cell for storing n-bit data.

16. The non-volatile memory device of claim 12, wherein each of the memory cells comprises a single-level memory cell for storing 1-bit data.

17. The non-volatile memory device of claim 12, wherein the program voltage is stepwise increased whenever program loops of a program cycle are repeated.

18. The non-volatile memory device of claim 12, wherein the voltage divider comprises:

a resistor connected between the program voltage and a divided voltage; and a first and a second variable resistance circuit connected in series between the divided voltage and a ground voltage, wherein the first variable resistance circuit has a first resistance value and a second resistance value that is different from the first resistance value, each of which is selected by the mode select signal, and the second variable resistance circuit has a plurality of resistance values being different from one another, each of which is selected by the step control signals.

19. The non-volatile memory device of claim 18, wherein the step control signals are sequentially activated according to whether each program loop of a program cycle is passed.

20. The non-volatile memory device of claim 12, wherein the voltage divider comprises a first, a second, and a third variable resistance circuit connected in series between the program voltage a ground voltage, the first and the second variable resistance circuits being controlled by the mode select signal and the third variable resistance circuit being controlled by the step control signals.

21. The non-volatile memory device of claim 20, wherein the first variable resistance circuit has a first resistance value and a second resistance value that is different from the first resistance value, each of which is selected by the mode select signal; the second variable resistance circuit has a third resistance value and a fourth resistance value that is different from the third resistance value, each of which is selected by the mode select signal; and the second variable resistance circuit has a plurality of resistance values being different from one another, each of which is selected by the step control signals, whereby a start voltage level of the program voltage is maintained constantly regardless of the mode of operation.

22. The non-volatile memory device of claim 21, wherein the step control signals are sequentially activated according to whether each of program loops of a program cycle is passed.

* * * * *